(12) United States Patent
Jin et al.

(10) Patent No.: US 8,053,310 B2
(45) Date of Patent: Nov. 8, 2011

(54) METHOD FOR DEFECT REDUCTION FOR MEMORY CELL CAPACITORS

(75) Inventors: Ling Jin, Shanghai (CN); Dah Cheng Lin, Shanghai (CN); Chin Hsing Yu, Shanghai (CN); Meng Jan Cherng, Shanghai (CN); Huan Sung Fu, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 559 days.

(21) Appl. No.: 12/259,138

(22) Filed: Oct. 27, 2008

(65) Prior Publication Data

US 2010/0003794 A1     Jan. 7, 2010

(30) Foreign Application Priority Data

Jul. 2, 2008  (CN) .......................... 2008 1 0040286

(51) Int. Cl.
*H01L 21/8242*   (2006.01)

(52) U.S. Cl. ................ 438/253; 438/396; 257/E21.008

(58) Field of Classification Search .................. 438/239, 438/253–255, 396–398; 257/E21.008
See application file for complete search history.

(56) References Cited

U.S. PATENT DOCUMENTS

2010/0003794 A1 *  1/2010  Jin et al. .................. 438/253

* cited by examiner

*Primary Examiner* — Jack Chen
(74) *Attorney, Agent, or Firm* — Kilpatrick Townsend and Stockton LLP

(57) ABSTRACT

A method for forming a cylindrical stack capacitor structure. A semiconductor substrate is provided. Storage node structures are formed in a memory cell region. A dielectric layer is formed overlying the storage node structures. A patterning and a first etching process expose the storage nodes. A polysilicon layer and a rugged polysilicon layer are formed overlying the exposed storage nodes. The memory cell region is masked, exposing a peripheral region. A chemical dry etch process removes the rugged polysilicon and the polysilicon layers in the peripheral region. The rugged polysilicon and the polysilicon layers are planarized followed by a dielectric recess. The resulting cylindrical stack capacitor structures are substantially free of defects from rugged polysilicon remaining in the peripheral region thereby improving device yield and process window.

20 Claims, 12 Drawing Sheets

METHOD FOR DEFECT REDUCTION FOR MEMORY CELL CAPACITORS

CROSS-REFERENCE TO RELATED APPLICATIONS

This application claims priority to Chinese Patent Application No. 200810040286.0, filed Jul. 2, 2008, commonly assigned, and incorporated herein by reference for all purposes.

BACKGROUND OF THE INVENTION

The present invention is directed to integrated circuits and their processing for the manufacture of semiconductor devices. More particularly, the invention provides a method and structures for manufacturing capacitor structures for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of cell regions for dynamic random access memory devices. Such process includes, among others, those for the memory array in stacked based capacitors and trench based capacitors. Although there have been significant improvements, such designs still have many limitations. As merely an example, these designs must become smaller and smaller but still provide efficient device reliability and operability. Additionally, these conventional cell regions are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques directed to integrated circuits and their processing for the manufacture of semiconductor devices are provided. More particularly, the invention provides a method and structures for manufacturing capacitor structures for dynamic random access memory devices, commonly called DRAMs. But it would be recognized that the invention has a much broader range of applicability.

In a specific embodiment, the present invention provides a method for manufacturing an integrated circuit device, e.g., dynamic random access memory, application specific integrated circuit device, microprocessor device. The method includes providing a semiconductor substrate, e.g., silicon wafer. The semiconductor substrate has a surface region. The method includes forming a planarized dielectric layer (e.g., borophosphosilicate glass, fluorinated glass, atmospheric oxide) overlying the surface region. The planarized dielectric layer has a capacitor region and a peripheral region. The peripheral region has a recessed region, which is characterized by a dimension of about one micron and less. The method includes forming one or more cylindrical stack capacitor structures within the capacitor region. The method includes forming a blanket rugged polysilicon material overlying the one or more cylindrical stack capacitor structures and the peripheral region. The blanket rugged polysilicon material has a portion being trapped by the recessed region. In a preferred embodiment, the blanket rugged polysilicon material is deposited using chemical vapor deposition or other suitable techniques. The method forms a masking layer overlying the one or more cylindrical stack capacitor structures while exposing at least the recessed region in the peripheral region. In a preferred embodiment, the masking layer is patterned using photolithographic techniques. The method includes subjecting at least the recessed region including the portion of the trapped blanket rugged polysilicon material to a plasma etching environment to cause removal of the trapped blanket rugged polysilicon material. The method includes processing using a chemical mechanical planarizing process an upper region including at least the exposed recessed region to remove any residual blanket rugged polysilicon material and at least one other layer overlying a portion of the peripheral region.

In an alternative specific embodiment, the present invention provides a method for manufacturing an integrated circuit device. The method includes providing a semiconductor substrate, e.g., a silicon wafer. The semiconductor substrate has a surface region. The method includes forming a planarized dielectric layer overlying the surface region. The planarized dielectric layer has a planarized surface region. In a preferred embodiment, the planarized dielectric layer is spatially disposed within a capacitor region. A portion of a peripheral region is recessed relative to the planarized surface region of the planarized dielectric region. The method includes forming a blanket conductor material overlying the planarized surface region and the peripheral region. The conductor material has a portion trapped by a portion of the peripheral region. The method includes forming a masking layer overlying a portion of the planarized surface region while exposing at least the portion of the peripheral region. The method includes subjecting at least the portion of the blanket conductive material in the peripheral region to a plasma etching environment to cause removal of the blanket conductive material in the peripheral region. In a preferred embodiment, the method includes processing using a chemical mechanical planarizing process an upper region including at least the portion of the planarized conductive material to remove any residual material and at least one other layer.

In yet an alternate embodiment, the present invention provides a method for manufacturing an integrated circuit device. The method includes providing a semiconductor substrate, which has a surface region. The method includes forming a planarized dielectric layer overlying the surface region. The planarized dielectric layer has a planarized surface region and a peripheral region. In a preferred embodiment, the peripheral region has a recessed region, which has a dimension of about 1 micron and less. The method includes forming a blanket conductive material overlying the planarized surface region and the peripheral region. The blanket conductor material has a portion being trapped in a portion of the peripheral region. The method includes forming a masking layer overlying a portion of the planarized surface region while exposing at least the recessed region in the peripheral region. The method also includes subjecting at least the portion of the recessed region including the portion of the blanket conductive material to a plasma etching environment to cause removal of the blanket conductive material at least in the recessed region in the peripheral region.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. The resulting integrated circuit devices are substantially free of defects from conductor material remaining in the peripheral region. Preferably, the invention provides for an improved process integration for design rules of 0.18 microns and less. In particular, the present invention allows for the capacitor structures to be less than about 0.1 micron to about 0.15 micron from each other, according to a preferred embodiment. A 40% yield improvement has been demonstrated as a result of reduced defects. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1A:
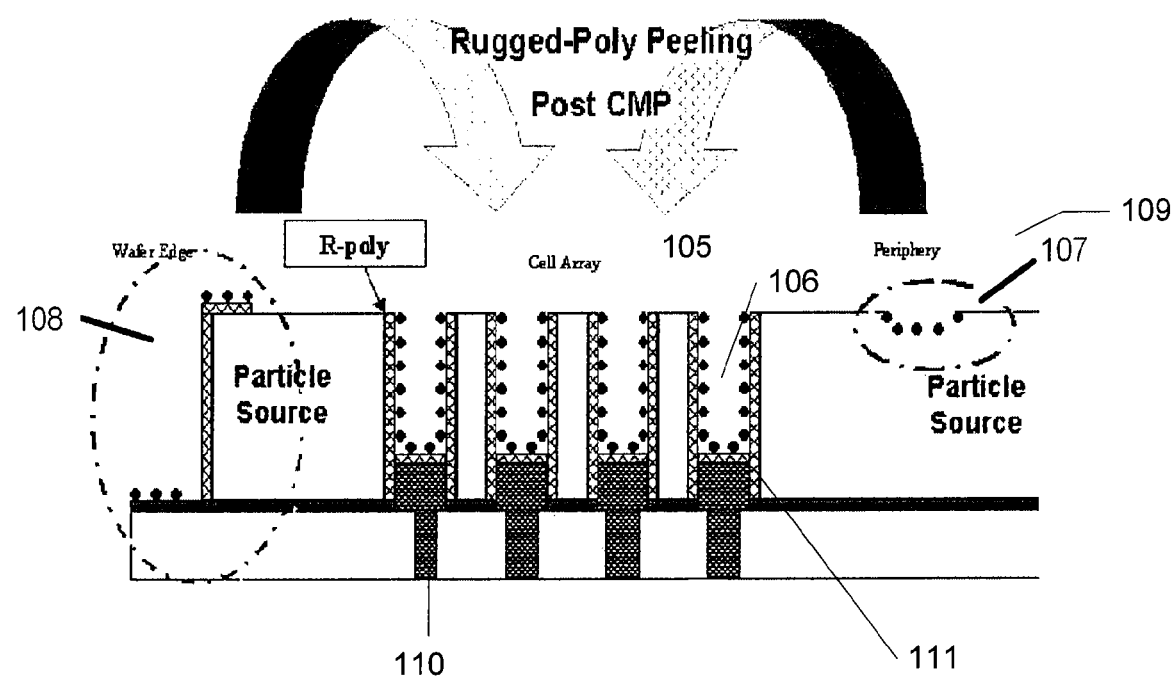
FIG. 1(a) illustrate a conventional method for fabricating capacitor structures for a dynamic random memory device.

According to the present invention, techniques directed to integrated circuits and their processing for the manufacture of semiconductor devices are provided. By way of example, the invention provides a method for fabricating a capacitor structure for dynamic random access memory devices, commonly called DRAMs. But it would be recognized that the invention has a much broader range of applicability. For example, the invention can be applied to microprocessor devices, memory devices, application specific integrated circuit devices, as well as others.

A method for fabricating an integrated circuit device can be briefly provided as follows:

1. Provide a semiconductor substrate, e.g., silicon wafer;
2. Provide a surface region on the semiconductor substrate;
3. Form a dielectric layer overlying the surface region;
4. Planarize the dielectric layer
5. Define a capacitor and a peripheral region, the peripheral region has a recessed region;
6. Form one or more cylindrical stack capacitor structures within the capacitor region;
7. Form a blanket rugged polysilicon material overlying the one or more cylindrical stack capacitor structures and the peripheral region, a portion of the blanket rugged polysilicon material is trapped in the recessed region in the peripheral region;
8. Form a masking layer overlying the one or more cylindrical stack capacitor structures and exposing at least the recessed region in the peripheral region;
9. Subject at least the recessed region in the peripheral region including the blanket rugged polysilicon material to a plasma etching environment to remove the blanket rugged polysilicon material at least in the recess region in the peripheral region;
10. Planarize an upper region to remove a portion of the rugged polysilicon material, a portion of the dielectric layer and a portion of at least one other layer using a chemical mechanical polishing process.

The above sequence of steps provides a method according to an embodiment of the present invention. As shown, the method uses a sequence of steps to provide one or more of cylindrical stack capacitor structures including a way to selectively remove a rugged polysilicon material trapped in a recessed region of a peripheral region of a semiconductor device. Merely by way of example, the method provides a method for fabricating capacitor structures for dynamic random access memory devices. Other alternatives can also be provided where steps are added, one or more steps are removed, or one or more steps are provided in a different sequence without departing from the scope of the invention. Further details of the present invention can be found throughout the present specification and more particularly below.

An alternative method according to the present invention may be outlined as fellows:

1. Provide a semiconductor substrate, e.g., silicon wafer;
2. Provide a surface region on the semiconductor substrate;
3. Form a dielectric layer overlying the surface region;
4. Planarize the dielectric layer
5. Define a planarized surface region and a peripheral region, the peripheral region has a recessed region;
6. Form a blanket conductive material overlying the planarized surface region and the peripheral region;
7. Form a masking layer overlying a portion of the planarized surface region and expose at least the recessed region in the peripheral region;
8. Subject at least the recessed region in the peripheral region including the blanket material to a plasma etching environment to remove the blanket conductive material at least in the recess region in the peripheral region.

The above sequence of steps provides a method according to an embodiment of the present invention. As shown, the method uses a sequence of steps including a way to selectively remove a conductive material trapped in a recessed region of a peripheral region of a semiconductor device. Other alternatives can also be provided where steps are added, one or more steps are removed, or one or more steps are provided in a different sequence without departing from the scope of the invention. Further details of the present invention can be found throughout the present specification and more particularly below.

Yet an alternative method according to the present invention may be outlined as fellows:

1. Provide a semiconductor substrate, e.g., silicon wafer;
2. Provide a surface region on the semiconductor substrate;
3. Form a dielectric layer overlying the surface region;
4. Planarize the dielectric layer
5. Define a planarized surface region and a peripheral region, the peripheral region has a recessed region;
6. The planarized dielectric layer is spatially disposed within a capacitor region;
7. Form a blanket conductive material overlying the planarized surface region and the peripheral region;
8. Form a masking layer overlying a portion of the planarized surface region and exposing at least the recessed region in the peripheral region;
9. Subject at least the recessed region in the peripheral region including the blanket material to a plasma etching environment to remove the blanket conductive material at least in the recess region in the peripheral region;
10. Planarize an upper region to remove a portion of the conductive material, a portion of the dielectric layer and a portion of at least one other layer using a chemical mechanical polishing process.

The above sequence of steps provides a method according to an embodiment of the present invention. As shown, the method uses a sequence of steps to provide a capacitor structure including a way to selectively remove a conductive material trapped in a recessed region of a peripheral region of a semiconductor device. Other alternatives can also be provided where steps are added, one or more steps are removed, or one or more steps are provided in a different sequence without departing from the scope of the invention. Further details of the present invention can be found throughout the present specification and more particularly below.

It is critical to keep sufficient capacitance in a reduced cell for dynamic random access memory device application when the technology is scaled down to 0.16 um and beyond. Increasing capacitor area has become a preferred approach for increasing cell capacitance. For a cylindrical stacked capacitor, rugged-polysilicon or hemispherical-grained (HSG) technology is an effective way to increase surface area and capacitance in memory cells. In addition, an oxide-recess to expose an outer-wall is also effective in increasing surface area of a cylindrical stacked capacitor. According to an embodiment of the present invention, an inner wall with rugged-polysilicon/HSG and an outer wall with a flat polysilicon surface is used for cylindrical stacked capacitor application.

With constant geometric shrinking in integrated circuits, increasing chemical mechanical polishing (CMP) process steps have been used for global planarization, especially in the back-end of line processes. CMP has limitations that cause defects leading to yield loss in conventional capacitor fabrication. As merely as an example, in the fabrication of cylindrical stack capacitor for DRAM device application using rugged polysilicon, defects may result from rugged polysilicon trapped in a portion of peripheral area which is difficult to remove using CMP. The peripheral area includes wafer edge area, scribe line area and others. In certain embodiment, the portion of the peripheral area includes a recessed region. Rugged polysilicon trapped causes peeling defects in subsequent process step resulting in cell bridging and pair bit failure in final CP tests. To eliminate defects and to improve yield, a preferred method with an additional photo and dry etch process is included, as demonstrated in the DRAM process described below as well as other portions of the present specification.

FIG. 1(a) is a simplified diagram illustrating post CMP defects according to a conventional method of fabricating a cylindrical stack capacitor structure. A capacitor array region 105 and a peripheral region 109 are shown. A partially completed capacitor structures 106 in the memory cell array 105 including a plurality of storage nodes 110 are shown. The capacitor structure also includes a conductive material 111. Also shown in FIG. 1(a) is a recessed region 107 in the peripheral region which traps conductive material. Conductive material remained in an area near wafer edge 108 due to limitation of CMP process is also shown. The area near wafer edge is characterized by an area that is about 2 mm from wafer edge in certain embodiments. In both cases, peeling defects would occur in subsequent processes resulting in yield loss.

Figure 1B:
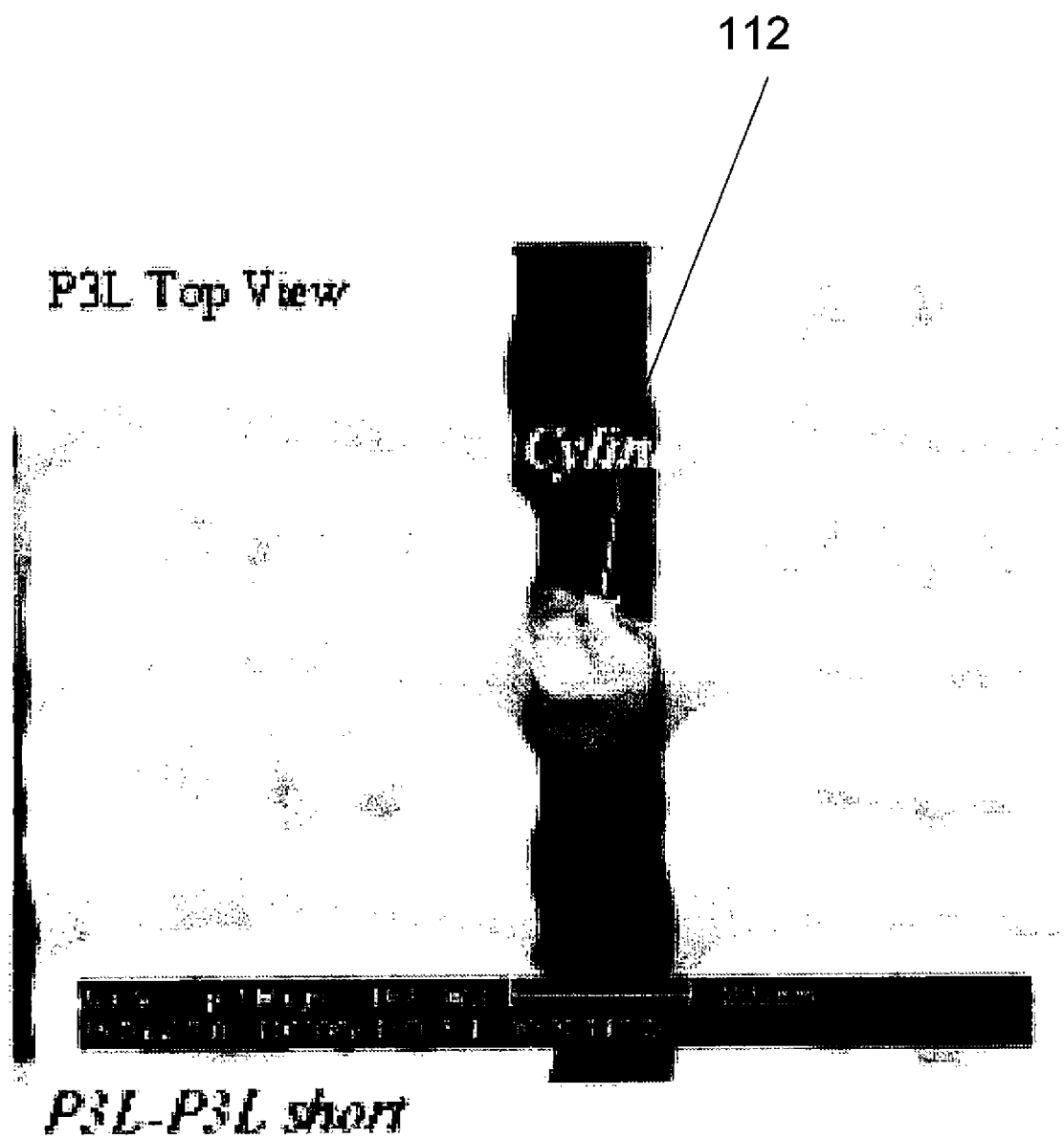
FIG. 1(b) is a picture from scanning electron microscope showing a pair bit failure due to the defects using a conventional method of fabricating capacitor structures for a dynamic random memory device.

FIG. 1(b) shows a scanning electron microscope (SEM) picture of cell bridging and pair-bit failure as a result of a peeling defect 112.

According to a preferred embodiment, the present invention provides a method for a capacitor formation, in which peeling defects will be reduced, resulting in an increase in yield and an increase in process window. An average increase of 40% or more in CP yield has been demonstrated for 64 Megabit dynamic random access memory device products.

Figure 2:
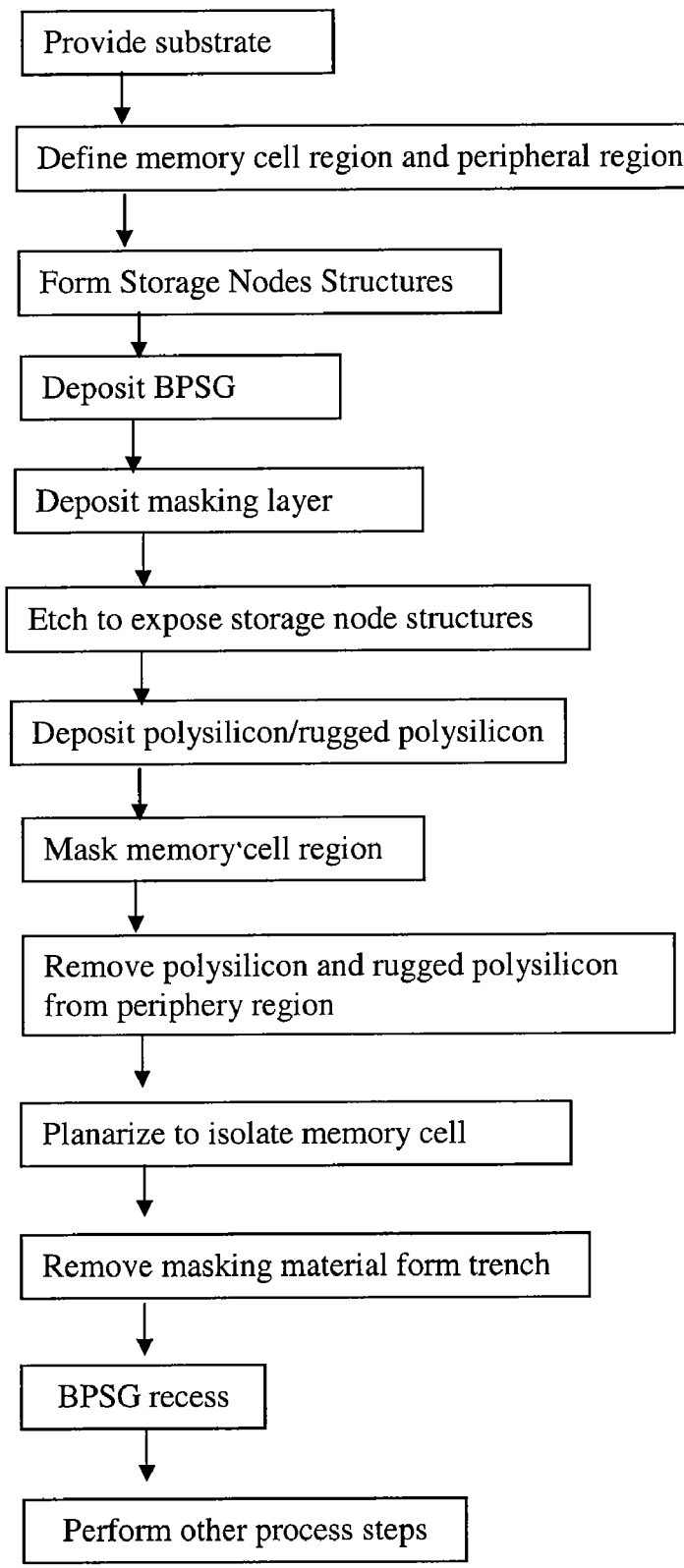
FIG. 2 is a simplified flow diagram of a preferred method of fabricating a capacitor structure according to an embodiment of the present invention.

A method for fabricating an integrated circuit device including capacitor structures for a dynamic random access memory device according to a specific embodiment of the present invention is-shown in FIG. 2:

1. Provide a semiconductor substrate, e.g., silicon wafer;
2. Provide a surface region on the semiconductor substrate;
3. Define a capacitor region and a peripheral region, the peripheral region has a recessed region;
4. Form a plurality of storage node structures in the memory cell region;
5. Form a dielectric layer (e.g. borophosphosilicate glass or BPSG) overlying the plurality of the storage node structures in the memory cell region and the peripheral region;
6. Planarize the dielectric layer;
7. Pattern the planarized dielectric layer to expose a portion of each of the plurality of the storage node structures in the capacitor region and to cause the planarized dielectric layer to be in a spatial configuration;
8. Form a blanket conductive material (e.g., rugged polysilicon) overlying the capacitor region and the peripheral region;
9. Form a masking layer overlying a portion of the capacitor region and expose at least the recessed region in the peripheral region;
10. Subject at least the recessed region in the peripheral region including the blanket material to a plasma etching environment to remove the blanket conductive material at least in the recess region in the peripheral region.
11. Deposit a second masking layer overlying the conductive material;
12. Pattern the second masking layer to expose the peripheral region while masking the capacitor region;
13. Perform a second etching process to remove the conductive material from the peripheral region;
14. Perform a planarizing process to remove a portion of the conductive material, a portion of the dielectric layer, and a portion of the second masking layer using a chemical mechanical polishing (CMP) process;

13. Remove other portions of the second masking layer;

14. Perform a third etching process (e.g., a BPSG recess) to remove the dielectric layer;

15. Perform other steps, as required.

The above sequence of steps provides a method according to an embodiment of the present invention. As shown, the method uses a combination of steps including a way to remove conductive material trapped in certain regions of a peripheral region of an integrated device. By way of example, the method provides a way to fabricate cylindrical capacitor structure for a dynamic random access memory device. Because the conductive material is removed from the peripheral region prior to a CMP process, defects resulting from conductive material remaining are eliminated. In a specific embodiment, the invention provides improved die yield in the fabricating of memory devices. Of course, other alternatives can also be provided where steps are added, one or more steps are removed, or one or more steps are provided in a different sequence without departing from the scope of the claims herein. Further details of the present method can be found throughout the present specification and more particularly below.

FIGS. 3-11 show process steps for forming a cylindrical stack capacitor for a dynamic random access memory device in accordance to an embodiment of the present invention. These diagrams are merely examples which should not unduly limit the scope of the claims. One of ordinary skill in the art would recognize many variations, alternatives, and modifications.

Figure 3:
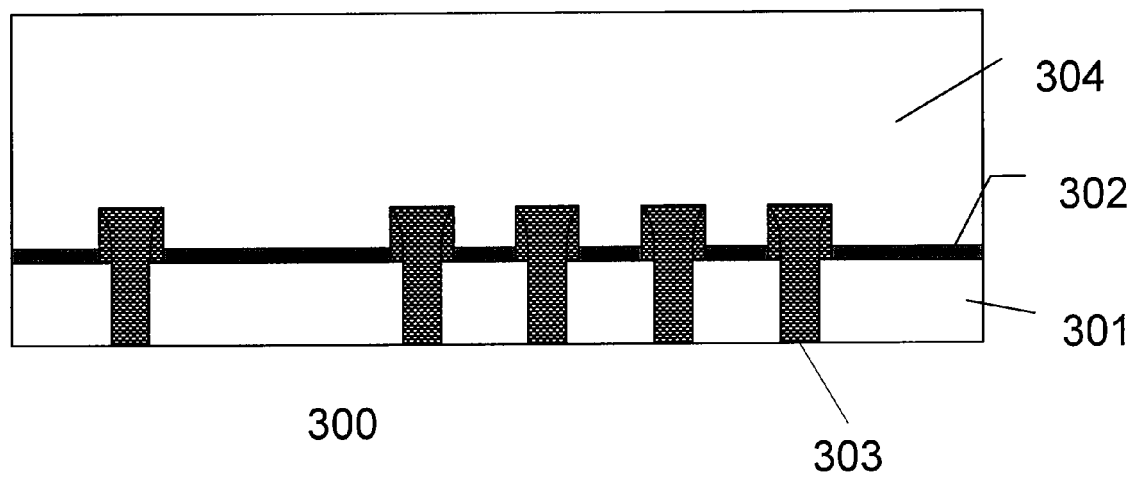
FIGS. 3 through 11 are simplified diagrams illustrating a method for forming a capacitor structure for a memory device according to an embodiment of the present invention.

As shown in FIG. 3, a semiconductor substrate 300 is provided. The semiconductor substrate can be a silicon wafer or a silicon on insulator (SOI) or others. A first insulating layer 301 is formed overlying the semiconductor substrate. The first insulating layer comprises of silicon dioxide formed by a high density plasma process. Other suitable dense insulating materials such as thermal oxide may also be used. A second insulating layer 302 is formed overlying the first insulating layer. The second insulating layer comprises of silicon nitride or other suitable insulating materials. A plurality of storage nodes 303 are formed in a portion of the first insulating layer and in a portion of the second insulating layer. The plurality of storage nodes comprise of polysilicon doped with phosphorus bearing species. A dielectric layer 304 is formed overlying the plurality of storage node structures and the second insulating layer. The dielectric layer comprises of borophosphosilicate glass commonly known as BPSG, formed by a suitable techniques including chemical vapor deposition. Other suitable dielectric materials may also be used. A reflow process planarizes the dielectric layer. Other suitable planarizing process such as a CMP process or a dry etch process may also be used.

Figure 4:
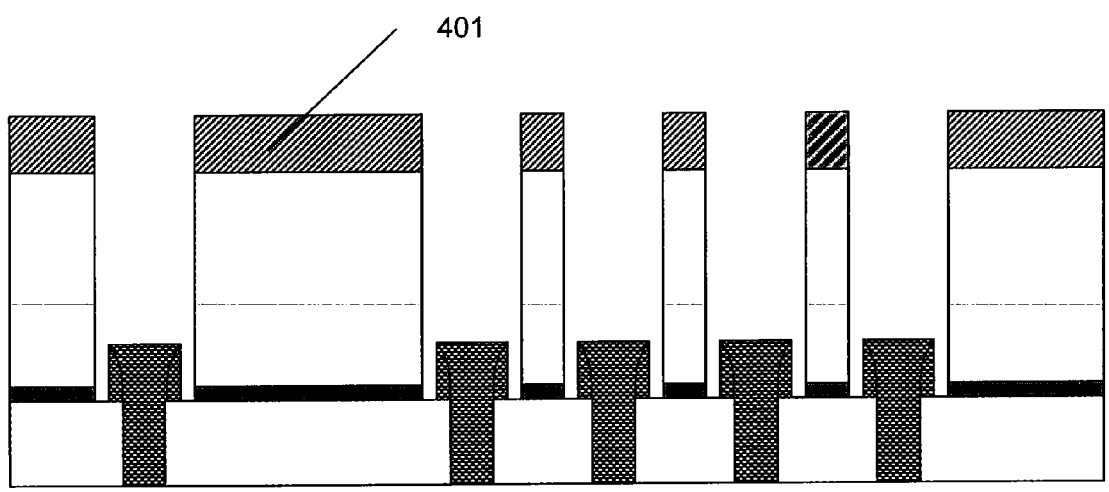

In FIG. 4, a patterning mask 401 is formed overlying the planarized dielectric layer. An etching process causes the planarized dielectric layer to be spatially disposed within the memory cell region. Preferably, a portion of the storage nodes is exposed. The patterning mask comprises of a photoresist material. Other suitable patterning masks such as a hard mask may also be used.

Figure 5:
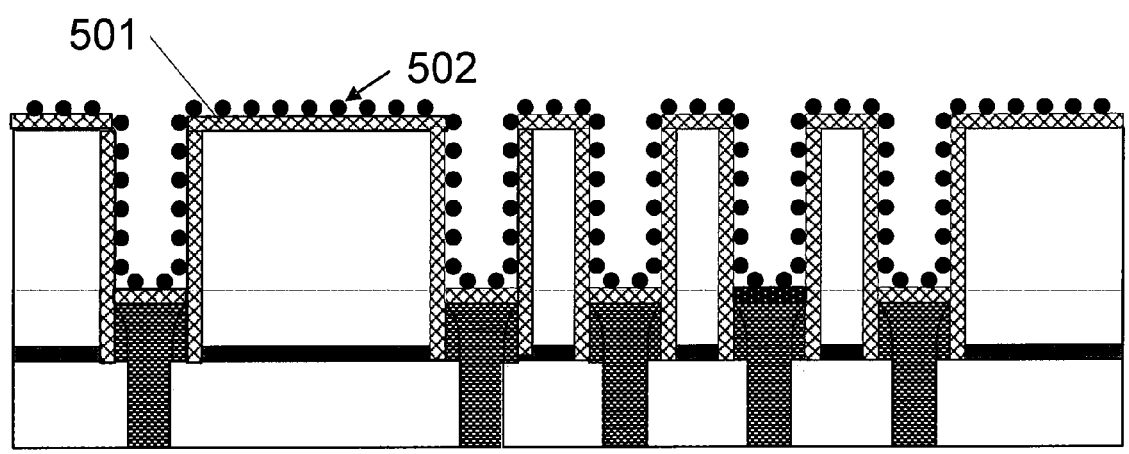

FIG. 5 shows the deposition of a blanket conductive material overlying the exposed storage nodes and the planarized dielectric layer. As merely an example, the conductive material comprises of a rugged polysilicon. First, a polysilicon layer 501 is formed overlying the exposed portion of the storage nodes and the dielectric layer. The polysilicon layer is doped with phosphorus with a dosage ranging from of $1.3 \times 10^{21}$ atoms cm$^{-3}$ to $1.5 \times 10^{21}$ atoms cm$^{-3}$. A rugged polysilicon material 502 is formed overlying the polysilicon layer. The rugged polysilicon layer is formed by chemical vapor deposition using silane (SiH$_4$) at a temperature of about 560 degree Celsius. Other suitable process parameters may also be used. The resulting rugged polysilicon has a grain size of about 0.06 micron and less. Other conductive materials such as metal materials or polysilicon doped with a suitable impurity may also be used depending on the application.

Figure 6:
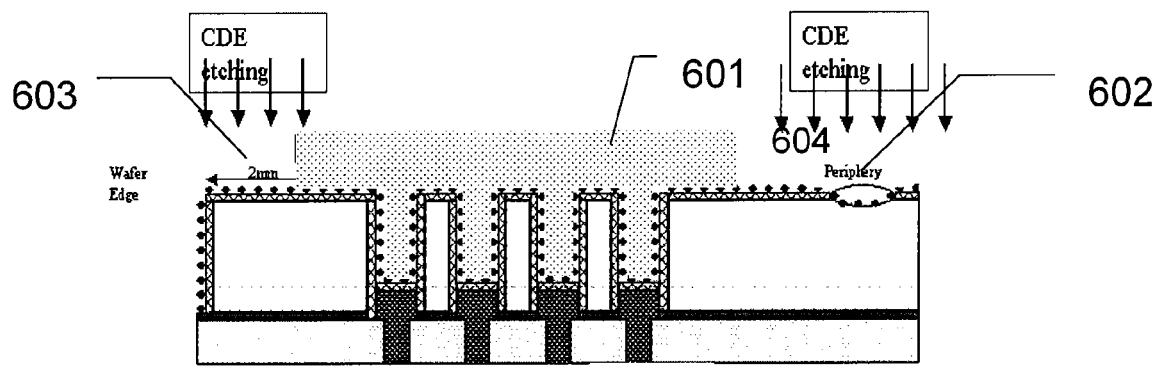
Figure 7:
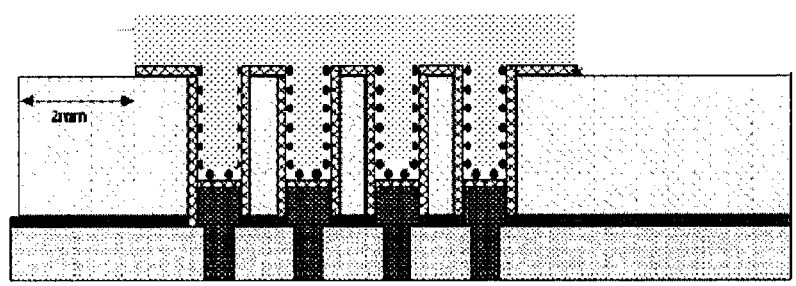

As illustrate in FIG. 6, a patterning masking 601 is formed overlying the conductive material in the capacitor region while the peripheral region 604 including a recessed region 602 and an area near the wafer edge 603 is exposed. The area near the wafer edge is approximately 2 mm from the wafer edge in certain embodiment. In a specific embodiment, the recessed region is characterized by a dimension of about 1 micron and. The recessed region traps conductive material. As shown, a chemical dry etch (CDE) process removes the conductive material from the peripheral region including the conductive material in the recessed region and the conductive material in the area near wafer edge while the capacitor region is being masked. The result is shown in FIG. 7.

Figure 8:
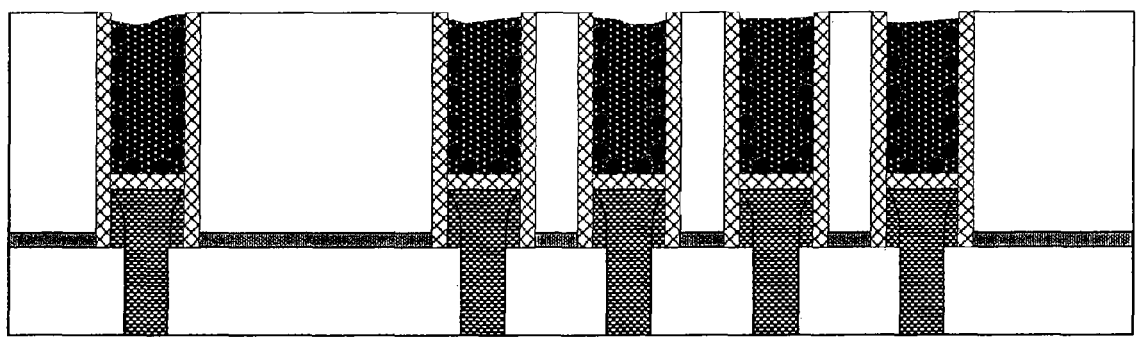

Shown in FIG. 8, a planarizing process is used to remove a portion of the conductive material, a portion of the dielectric layer, and a portion of the patterning mask to isolate each of the capacitor structures in the capacitor region. A chemical mechanical polishing (CMP) process is used. As the conductive material is removed from the peripheral region prior to CMP, defects resulting from conductive material remained are eliminated. Other suitable planarizing process may also be used depending on the application.

Figure 9:
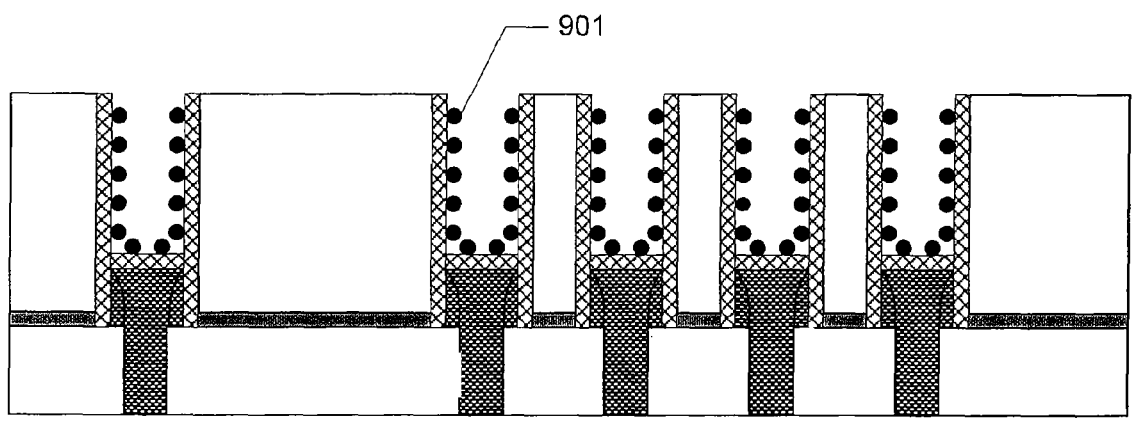

FIG. 9 illustrates the removal of remaining patterning mask from trenches of capacitor structures. In a specific embodiment, rugged polysilicon is used as the conductive material, a photoresist strip process including a wet etch in a mixture of sulfuric acid and hydrogen peroxide is used. As shown, inner wall 901 of the capacitor comprises of rugged polysilicon. Of course, other suitable photoresist strip process would be used depending on the application.

Figure 10:
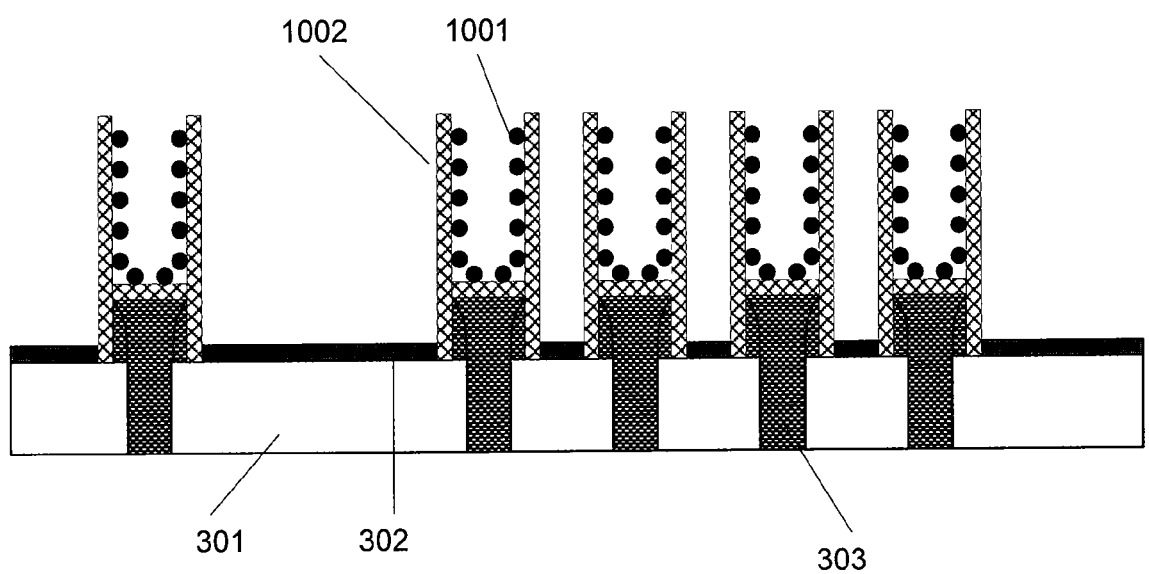

The dielectric layer is removed to expose the outer wall of the capacitor structures. In a specific embodiment, a wet etch process in HF is used. As shown in FIG. 10, the resulting capacitor structure has a inner wall 1001 and an outer wall 1002. In a specific embodiment, rugged polysilicon overlies the inner wall 1001 and outer wall 1002 is flat. The rugged polysilicon is doped with phosphorus by subjecting to a phosphine (PH$_3$) anneal.

Figure 11:
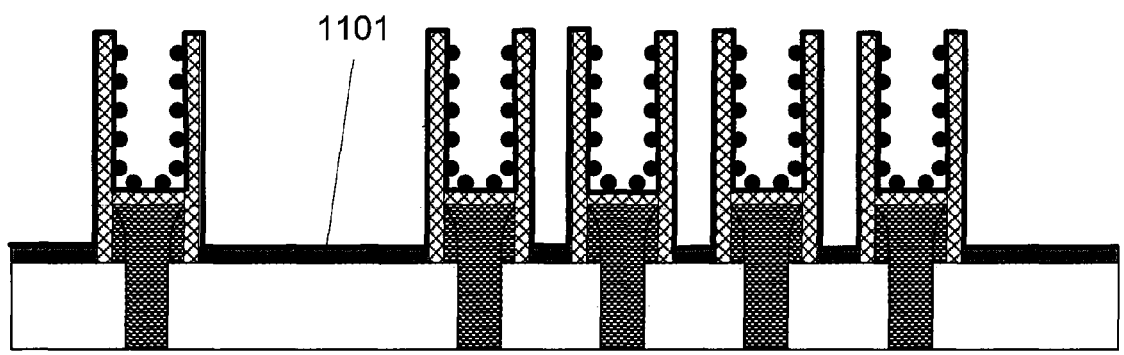

As illustrated in FIG. 11, a capacitor insulating material 1101 is deposited overlying the conductive material including the inner wall and the outer wall of the memory cells. The capacitor insulating layer comprises of a silicon oxynitride. The silicon oxynitride is formed by depositing a blanket layer of silicon nitride followed by a wet top-oxidation process. Other suitable capacitor insulating material such as silicon oxide, silicon nitride or a combination may also be used.

Figure 12:
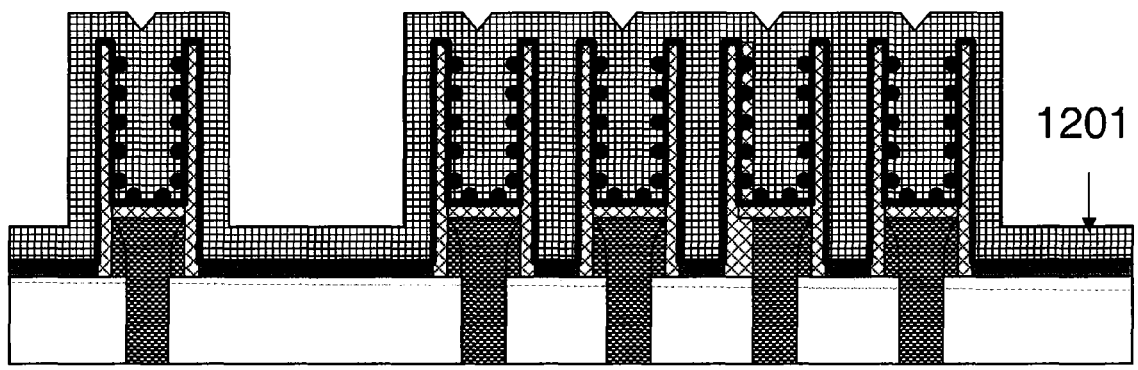
FIG. 12 is a simplified cross-sectional view of a completed capacitor structure for a memory device according to an embodiment of the present invention.

As shown in FIG. 12, the capacitor structure is completed by depositing a top plate electrode layer 1201 using a polysilicon fill material. The polysilicon fill material is doped with phosphorus at a dosage ranging from.

It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing an integrated circuit device, the method comprising:

providing a semiconductor substrate, the semiconductor substrate comprising a surface region;

forming a planarized dielectric layer overlying the surface region, the planarized dielectric layer having a capacitor region and a peripheral region, the peripheral region having a recessed region, the recessed region having a dimension of about 1 micron and less;

forming one or more cylindrical stack capacitor structures within the capacitor region;

forming a blanket rugged polysilicon material overlying the one or more cylindrical stack capacitor structures and the peripheral region, the blanket rugged polysilicon material having a portion being trapped by a portion of the peripheral region including the recessed region;

forming a masking layer overlying the one or more cylindrical stack capacitor structures while exposing at least the recessed region in the peripheral region;

subjecting at least the recessed region including the portion of the trapped blanket rugged polysilicon material to a plasma etching environment to cause removal of the trapped blanket polysilicon material; and processing using a chemical mechanical planarization process an upper region including at least the exposed recessed region to remove any residual blanket rugged polysilicon material and at least one other layer overlying a portion of the peripheral region.

2. The method of claim 1 wherein the one or more of cylindrical stack capacitor structures is provided for a dynamic random access memory.

3. The method of claim 1 wherein the semiconductor substrate is characterized by a 300 millimeter substrate and greater.

4. The method of claim 1 wherein the device is characterized by a design rule of 0.6 micron and less.

5. The method of claim 1 wherein the one or more capacitor structures comprises at least two capacitor structures, the two capacitor structures including a first capacitor and a second capacitor, the first capacitor and the second capacitor having a spacing of 0.15 micron and less.

6. The method of claim 1 wherein the blanket rugged polysilicon material is characterized by grain size of one of more features of about 0.06 micron and less.

7. The method of claim 1 wherein the subjecting step and the chemical mechanical planarizing process are provided using only the masking layer, the masking layer being a single masking layer.

8. The method of claim 1 wherein the plasma etching environment comprises a fluorine bearing species.

9. The method of claim 1 wherein the one other layer is a polysilicon layer.

10. The method of claim 1 wherein the one other layer comprises a metal layer.

11. A method of manufacturing an integrated circuit device, the method comprising:

providing a semiconductor substrate, the semiconductor substrate comprising a surface region;

forming a planarized dielectric layer overlying the surface region, the planarized dielectric layer having a planarized surface region, the planarized dielectric layer being spatially disposed within a capacitor region, a peripheral region being recessed relative to the planarized surface region of the planarized dielectric layer;

forming a blanket conductive material overlying the planarized surface region and the peripheral region, the conductive material having a portion being trapped by a portion of the peripheral region;

forming a masking layer overlying a portion of the planarized surface region while exposing at least the portion of the peripheral region;

subjecting at least the portion of the blanket conductive material to a plasma etching environment to cause removal of the blanket conductive material; and processing using a chemical mechanical planarization conductive material to remove a portion of conductive material and at least one other layer overlying the portion of the peripheral region.

12. The method of claim 11 wherein the planarized dielectric layer comprises a recessed region, the recessed region being characterized by a portion of conductive material trapped therein, the portion of conductive material being removed by the plasma etching environment.

13. The method of claim 11 wherein the peripheral region comprises a wafer edge region.

14. The method of claim 11 wherein the peripheral region comprises a scribe line region.

15. A method of manufacturing an integrated circuit device, the method comprising:

providing a semiconductor substrate, the semiconductor substrate comprising a surface region;

forming a planarized dielectric layer overlying the surface region, the planarized dielectric layer having a planarized surface region and a peripheral region, the peripheral region having a recessed region, the recessed region having a dimension of 0.1 micron and less;

forming a blanket conductive material overlying the planarized surface region and the peripheral region, the blanket conductive material having a portion being trapped by a portion of the peripheral region;

forming a masking layer overlying a portion of the planarized surface region while exposing at least the recessed region in the peripheral region; and subjecting at least the portion of the recessed region including the portion of the blanket conductor material in the recessed region to a plasma etching environment.

16. The method of claim 15 wherein the blanket conductive material comprises a polysilicon material.

17. The method of claim 15 wherein the blanket conductive material comprises a metal material.

18. The method of claim 15 wherein the masking layer is a photolithographic material.

19. The method of claim 15 wherein the recessed region has a depth of about 2 micron and less from an upper portion of the planarized surface region.

20. The method of claim 15 wherein the semiconductor substrate comprises silicon and the planarized dielectric layer comprises a interlayer dielectric.

* * * * *